(12) United States Patent
Kruijt et al.

(10) Patent No.: US 8,592,854 B2
(45) Date of Patent: Nov. 26, 2013

(54) ELECTRONIC DEVICE AND A METHOD OF MANUFACTURING THE SAME

(75) Inventors: Peter G. M. Kruijt, Eindhoven (NL); Eric Rubingh, Geldrop (NL); Andrea Maione, Arlon (BE); Joanne Sarah Wilson, Dordrecht (NL)

(73) Assignee: Nederlandse Organisatie Voor toegepast-natuurwetenschappelijk Onderzoek TNO (NL)

( * ) Notice: Subject to any disclaimer, the term of this patent is extended or adjusted under 35 U.S.C. 154(b) by 0 days.

(21) Appl. No.: 13/265,452

(22) PCT Filed: Apr. 21, 2010

(86) PCT No.: PCT/NL2010/050215
§ 371 (c)(1),
(2), (4) Date: Mar. 30, 2012

(87) PCT Pub. No.: WO2010/123356
PCT Pub. Date: Oct. 28, 2010

(65) Prior Publication Data
US 2012/0175666 A1 Jul. 12, 2012

(30) Foreign Application Priority Data
Apr. 22, 2009 (EP) .................................... 09158501

(51) Int. Cl.
*H01L 33/00* (2010.01)
(52) U.S. Cl.
USPC ............... 257/99; 257/81; 257/448; 257/459; 257/E33.065; 257/E31.124; 438/32; 438/72; 438/578; 362/241

(58) Field of Classification Search
USPC ...................... 257/99, 81, 448, 459, E33.065, 257/E31.124; 438/32, 72, 578; 362/241
See application file for complete search history.

(56) References Cited

U.S. PATENT DOCUMENTS

| | | | |
|---|---|---|---|
| 2002/0122144 A1 | 9/2002 | Yoshida et al. | |
| 2003/0227254 A1 | 12/2003 | Terumoto | |
| 2004/0080280 A1* | 4/2004 | Hibino et al. ............... | 315/169.4 |
| 2004/0188671 A1 | 9/2004 | Tan et al. | |

(Continued)

FOREIGN PATENT DOCUMENTS

| | | |
|---|---|---|
| DE | 102006055884 A1 | 4/2008 |
| EP | 1484632 A1 | 12/2004 |

(Continued)

OTHER PUBLICATIONS

International Search Report dated Sep. 10, 2010 for International Application PCT/NL2010/050215 filed on Apr. 21, 2010 (4 pages total).

*Primary Examiner* — Tu-Tu Ho
(74) *Attorney, Agent, or Firm* — Banner & Witcoff, Ltd.

(57) ABSTRACT

The invention relates to a substantially transparent electronic device comprising a first contact surface provided with a first pattern of electrically conductive lines and a second contact surface provided with a second pattern of electrically conductive lines, the first contact surface extending parallel to the second contact surface, wherein the first pattern is rotationally displaced with respect to the second pattern by an angle between 15 and 165 degrees. The electrically conductive lines of the said first pattern and the said second pattern are substantially not transparent for visible light and are preferably used as shunting lines. The invention further relates to a method of manufacturing such device.

11 Claims, 3 Drawing Sheets

(56) References Cited

U.S. PATENT DOCUMENTS

| | | |
|---|---|---|
| 2005/0046338 A1 | 3/2005 | Park |
| 2006/0043406 A1 | 3/2006 | Tsubokura et al. |
| 2006/0215263 A1* | 9/2006 | Mi et al. ................... 359/486 |
| 2006/0273712 A1 | 12/2006 | Yaegashi |
| 2007/0046186 A1 | 3/2007 | Kim |
| 2007/0176169 A1 | 8/2007 | Lee et al. |
| 2007/0194697 A1 | 8/2007 | Kim et al. |
| 2007/0222915 A1 | 9/2007 | Niioka et al. |
| 2007/0284567 A1* | 12/2007 | Pokrovskiy et al. ......... 257/13 |
| 2008/0001537 A1 | 1/2008 | Chen et al. |
| 2010/0007269 A1 | 1/2010 | Klein et al. |
| 2010/0059365 A1 | 3/2010 | Valentin et al. |
| 2011/0041890 A1* | 2/2011 | Sheats .......................... 136/244 |

FOREIGN PATENT DOCUMENTS

| | | |
|---|---|---|
| EP | 1643814 A1 | 4/2006 |
| FR | 2913972 A1 | 9/2008 |
| GB | 2392558 A | 3/2004 |

* cited by examiner

ELECTRONIC DEVICE AND A METHOD OF MANUFACTURING THE SAME

CROSS-REFERENCE TO RELATED APPLICATIONS

This application is a U.S. National Stage application under 35 U.S.C. §371 of International Application PCT/NL2010/050215 (published as WO 2010/123356 A1), filed Apr. 21, 2010, which claims priority to Application EP 09158501.8, filed Apr. 22, 2009. Benefit of the filing date of each of these prior applications is hereby claimed. Each of these prior applications is hereby incorporated by reference in its entirety.

FIELD

The invention relates to a substantially transparent electronic device comprising a first contact surface provided with a first pattern of electrically conductive lines and a second contact surface provided with a second pattern of electrically conductive lines, the first contact surface extending parallel to the second contact surface.

BACKGROUND

An embodiment of the electronic device as is set forth in the opening paragraph is known from U.S. 2005/0046338. The known electronic device relates to an organic electroluminescent display (OELD) comprising a substrate, an organic electroluminescent unit arranged on a surface of the substrate and having a pair of opposing electrodes enveloping an organic electroluminescent layer. When suitable electric pulses are applied by the anode or cathode to the organic electroluminescent layer desired light emission there from is enabled.

Due to the fact that the known OELD is conceived to emit light in the visible range, materials used for respective structural layers of OELD are at least partially transparent. However, electrically conductive lines of the patterned cathode and the anode, arranged above each other in respective layers, optically interfere with each other causing a Moiré effect, which is undesirable.

In order to suppress or otherwise partially mitigate the Moiré effect, the known device comprises an additional layer of a porous material comprising cells, which is arranged at a pre-determined height offset from the functional layers of the OELD. In accordance to U.S. 2005/0046338 such distance has to be set between 10 and 100 micrometers for mitigating Moiré effect. In order to facilitate such pre-determined spacing, the known electronic device comprises side walls cooperating with the layer of the porous material.

It is a disadvantage of the known electronic device that additional manufacturing steps, like arranging the walls and the layer of porous material are to be carried out in order to mitigate the Moiré effect.

SUMMARY OF THE INVENTION

It is an object of the invention to provide a substantially transparent electronic device wherein the Moiré effect is mitigated using simple means.

To this end in the electronic device according to the invention the first pattern is rotationally displaced with respect to the second pattern by an angle between 15 and 165 degrees and wherein the electrically conductive lines of the said first pattern and the said second pattern are
substantially non-transparent for visible light.

The technical measure of the invention is based on the insight that instead of aiming at perfect alignment between respective conductive lines of the anode and the cathode, it is possible to mitigate the Moiré effect by rotating the patterns of the anode and the cathode with respect to each other, provided the electrically conducting lines forming the said first pattern and the said second pattern are substantially not transparent for visible light. It will be appreciated that the term 'substantially not transparent' shall be construed as having less than 50% transparency for visible light. Preferably, the said lines are used as shunting lines, which is advantageous for supporting the electrical conductivity of a large area electrode as shown in FIGS. 3a and b.

It will be appreciated that the patterns of the anode and the cathode may have similar or different shape. In the former case the rotational displacement relates to a respective arrangement of the lines of the anode and the cathode so that one and the same angle can be measured between similar lines forming similar portions of the pattern. For example, when the conductive lines of the anode and the cathode are arranged along a rectangular structure, the rotational displacement will be present when a line corresponding to a side of the rectangle of the anode is not parallel to a line of the corresponding side of the cathode's rectangle.

In case when respective patterns of the cathode and the anode are different, for example when for the anode a set of parallel lines is selected and for the cathode—a square, a rectangle, a diamond, a honeycomb, or the like, then the rotational displacement between the layers will be present when a dominant geometric direction of the anode's pattern, like a first vector along the parallel lines, is displaced with respect to a dominant geometric direction of the cathode patterns, like a second vector along a direction of the cathode's pattern.

For example, when a square pattern of lines having a 0 and 90 degree angulation with respect to a fictive axis is used for the cathode, and a pattern of parallel lines is used for the anode, the pattern of the parallel lines has to be rotated between 15 and 75 degrees with respect to the same fictive axis. As a result none of the lines of the cathode will be parallel to the lines of the anode thereby mitigating the Moiré effect.

In an embodiment of the electronic device according to the invention the first pattern and the second pattern are geometrically similar.

It is found to be advantageous to arrange conductive lines of the cathode and the anode in a similar pattern. For example, the pattern may relate to a set of parallel lines, or to a geometric figure which is translated over the respective contact surface. Rotational displacement in this case is achieved by rotating the pattern as a whole so that the majority of lines of the cathode and the anode are not parallel. Preferably, the angle of the rotational displacement is selected so that none of the lines at respective positions along the contact planes run parallel to each other.

Preferred embodiments of the similar patterns used for the cathode and the anode relate to a honeycomb structure, a triangle, a rectangle, mutually parallel lines, which may be straight or curved.

In a particular embodiment of the electronic device according to the invention, wherein the first pattern comprises a first square and the second pattern comprises a second square, the displacement angle between the first square and the second square is between 30 and 60 degrees.

These boundaries for the angle of rotational displacement are determined by the geometry, as it is understood that a square translates into itself when rotated by 90, 180, 270 and 360 degrees. In order to achieve a desired misalignment between the lines of the anode and the cathode, the rotational displacement between these structures is set between 30 and 60 degrees. However, the boundaries of the angle may be relaxed to yield a range of 15 to 75 degrees.

The invention further relates to an organic light emitting diode (OLED) comprising a device as is set forth with reference to the foregoing, wherein the first contact surface relates to the anode and the second contact surface relates to the cathode, OLED further comprising a functional layer disposed between the first contact surface and the second contact surface.

It is found to be particularly advantageous to provide an OLED wherein the Moiré effect is suitable mitigated in a simple way. An embodiment of an OLED is discussed with reference to FIG. 3.

A method of manufacturing a substantially transparent electronic device, according to the invention, comprises the steps of:

providing a first contact surface with a first pattern of electrically conductive lines;
providing a second contact surface extending substantially parallel to the first contact surface;
providing a second pattern of electrically conductive lines on the second contact surface, wherein the second pattern is rotationally displaced with respect to the first pattern by an angle between 15 and 165 degrees
selecting for the electrically conductive lines of the said first pattern and the said second pattern a material substantially not transparent for visible light.

In particular embodiment, the method according to the invention is used for manufacturing an OLED, wherein the method further comprising the steps of:

arranging an anode comprising on the first contact surface;
arranging a cathode on the second contact surface;
disposing a functional light emitting layer between the cathode and the anode.

By way of example, a substantially transparent electronic device according to the invention may be manufactured in accordance with the following sequence of steps.

For example, first a grid or pattern of lines of a conducting material may be applied on the substrate. It will be appreciated that a great variety of the per se known patterning techniques may be applied for this purpose. For example, the conducting lines may be deposited by lithography, by inkjet printing, using gravure, or flexo printing, or the like. Next, an electrode (an anode or the cathode) may be deposited on the set of lines. In case when the envisaged electronic device relates to OLED, the method may further comprise the step of applying a functional layer, for example, applying a hole injection layer, like PEDOT and applying the light emitting layer, like light emitting polymer, or light emitting small molecules. Next a further electrode (cathode) is deposited, followed by a deposition of a pattern of conductive lines which are deposited under an angle >e.g. 15° with respect to the pattern applied for the anode. It will be appreciated that respective patterns for the anode and the cathode preferably relate to the same pattern.

These and other aspects of the invention will be discussed in more detail with reference to drawings, wherein like reference numerals refer to like elements. It will be appreciated that the drawings are present for illustrative purposes and may not be used for limiting the scope of the appended claims.

DETAILED DESCRIPTION OF THE DRAWINGS

Figure 1B:
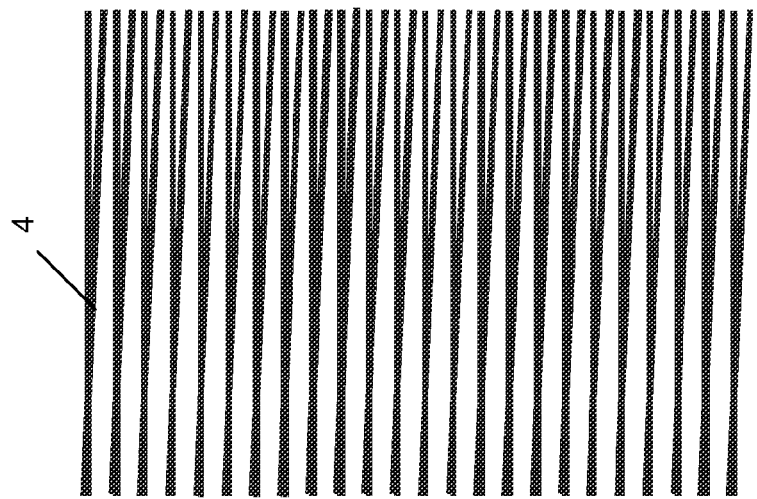
FIG. 1b presents schematically a second embodiment of the Moiré effect.
Figure 1A:
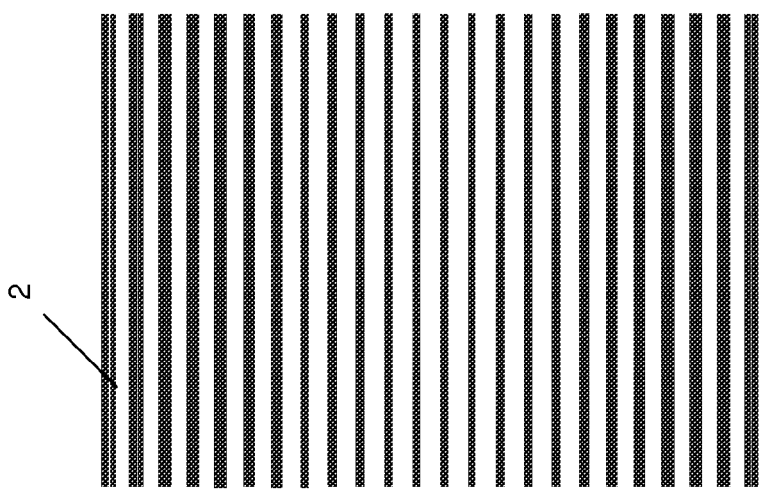
FIG. 1a presents schematically a first embodiment of the Moiré effect.

FIG. 1a presents schematically a first embodiment of the Moiré effect. In this embodiment optical interference is depicted which originates from two overlying patterns having slightly different pitch in line spacing, wherein the conducting lines are visible to a bare eye due to the fact that a material constituting these lines is substantially not transparent to visible light. Due to the Moiré effect the overall structures seems to comprise a periodic occurrence of seemingly thicker lines and seemingly thinner lines. Such optical interference is not desirable, particularly when it occurs on a display.

It will be appreciated that due to the fact that in a transparent electronic device, like a display, an OLED or the like have a non-zero spacing between respective electrodes arranged on a first contact surface and a second contact surface, as is explained with reference to the foregoing, some Moiré effect will always be present, even if the respective patterns on the first contact surface and the second contact surface perfectly match.

FIG. 1b presents schematically a second embodiment of the Moiré effect. In this particular embodiment an example of an optical interference pattern 4 is shown between lines of a first contact surface and lines of the second contact surface wherein said lines have a slight angular misalignment with respect to each other. Likewise, occurrence of such phenomenon in a substantially transparent electronic device is not desirable.

Figure 2:
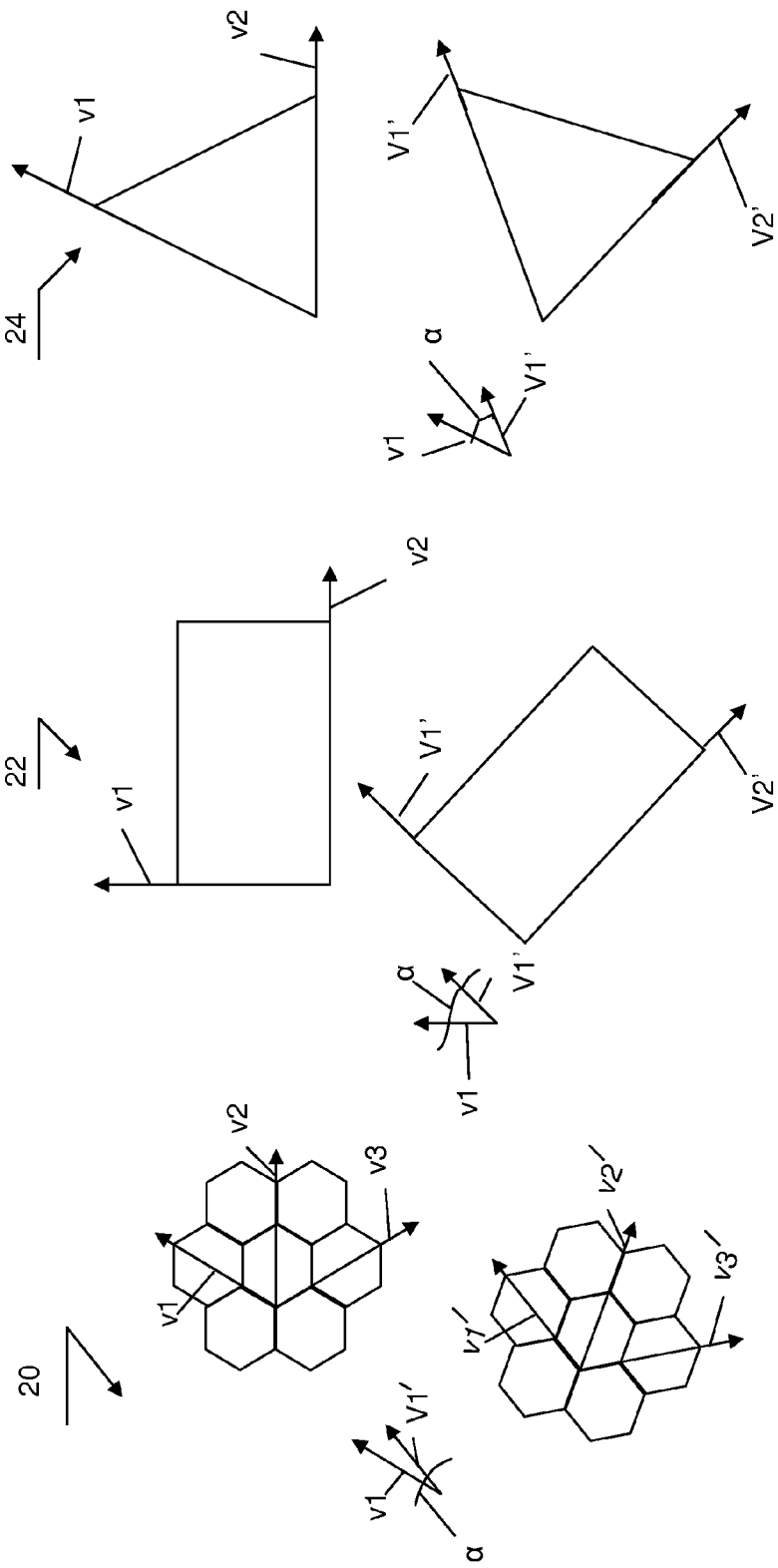
FIG. 2 presents schematically an embodiment of possible displaced patterns in accordance with the invention.

FIG. 2 presents schematically an embodiment of possible displaced patterns in accordance with the invention. In accordance to the invention, in order to mitigate the Moiré effect respective patterns of the lines arranged on the first contact surface (above) and the second contact surface (below) are arranged with a rotational displacement α.

For example, the respective patterns may relate to geometrically similar objects, like a hexagon 20, a rectangle 22, or a triangle 24. However, it will be appreciated that respective patterns may relate to a non-similar objects, like a suitable combination of the above, or a combination between a set of mutually parallel lines and a pattern obtained by a suitable translation of a geometric object.

In order to define the angle of rotational displacement α, suitable dominant directions in respective patterns may be defined. When turning to arrangement 20, representing hexagon structures, two vectors v1, v2, respectively v1', v2', may be defined in each structure for defining the angle between the patterns. It will be appreciated that the angle may be defined by a sole vector selected per similar structure per pattern. It will further be appreciated that the term 'similar structure' relates to a geometric object, like a (connection) line which may be found in both patterns. However, if a pattern is obtained by translation of a geometrical object which has a rotational symmetry, like a square, a line, a hexagon or a triangle, the rotational angle α should be selected so that lines on corresponding areas along a contact layer of the patterns are displaced from each other by at least 15 degrees. Therefore, for such patterns the range of allowable angles of rotational displacement may be less than [15-165] degrees, for example the angle may be [30-60] degrees for a square. Those skilled in the art will appreciate how the boundaries of the allowable angular displacement are to be determined for such objects.

Figure 3A:
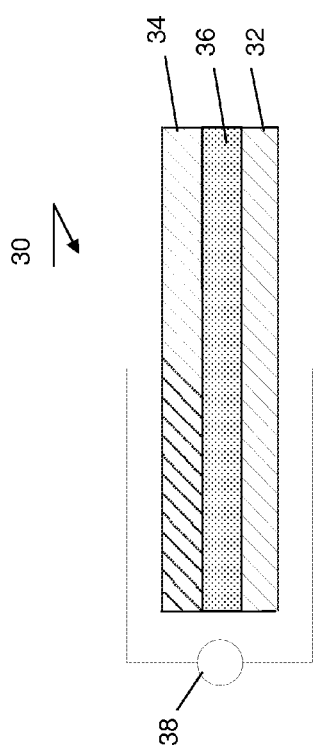
FIG. 3a presents schematically an embodiment of an OLED according to the invention.

FIG. 3a presents schematically an embodiment of an OLED according to the invention. The OLED 30 may comprise an anode layer 32, a cathode layer 34 and a functional light emitting layer 36 disposed between the anode layer 32 and the cathode layer 34. The functional light emitting layer may comprise one or more sub-layers, like a sub-layer of a light emitting polymer and a sub-layer of a hole injection material, like PEDOT. In order to induce suitable luminescence electrical power is supplied from a suitable source 38 to the anode 32 and the cathode 34. The anode 32 and the cathode 34 are suitable patterned for enabling a pixel-wise control of the light emitting layer 36.

Figure 3B:
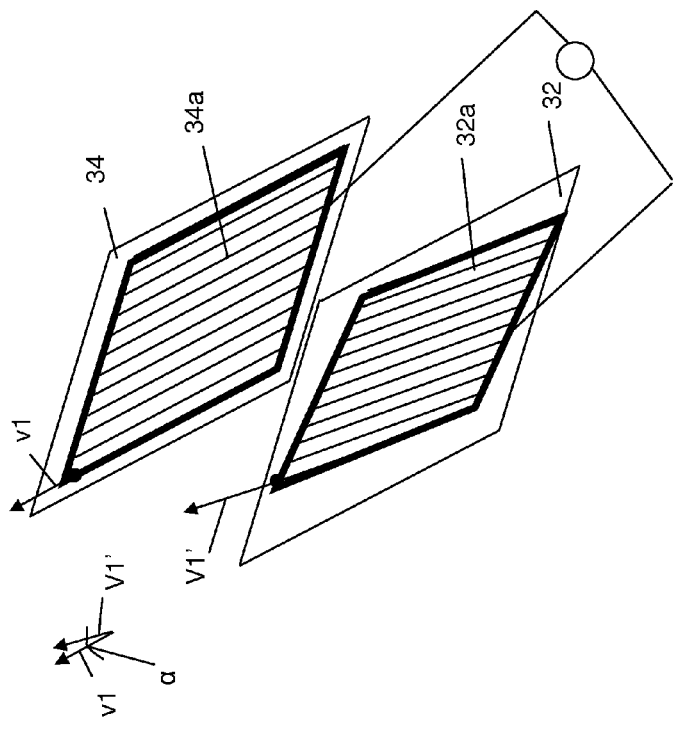
FIG. 3b presents schematically an embodiment of patterning of the OLED electrodes in accordance with the invention.

FIG. 3b presents schematically an embodiment of patterning of the OLED electrodes in accordance with the invention for mitigating Moiré effect. In this particular embodiment the anode 32 and the cathode 34 comprise respective patterns of a series of mutually parallel lines 32a, 34a. In order to mitigate the Moiré effect, the pattern of the anode 32a is rotationally displaced from the pattern of the cathode 34a by an angle between 15 and 165 degrees, which is measures between respective vectors V1, V1' aligned with respective lines of the patterns.

It will be appreciated that while specific embodiments of the invention have been described above, that the invention may be practiced otherwise than as described. In addition, isolated features discussed with reference to different figures may be combined. It will further be appreciated that the device according to the invention is also suitable for other devices than OLED, for example for electrochromic foils or windows as well as for organic or inorganic photocells.

In particular, the invention relates to an electrochromic device (EC) comprising an electronic device as is set forth in the foregoing, wherein the first contact surface relate to the anode and the second contact surface relate to the cathode, the EC further comprising a functional layer of material disposed between the first contact surface and the second contact surface, said functional layer being adapted to change its transmission to light in use. Additionally, the invention relates to an organic photovoltaic device (OPV) comprising an electronic device as is set forth in the foregoing, wherein the first contact surface relates to the anode and the second contact surface relates to the cathode, the OPV further comprising a functional organic change generation layer disposed between the first contact surface and the second contact surface.

It will further be appreciated that the general principles of operation of the OLED, the OPV and the EC as well as their respective structure are known per se and will not be explained here in detail.

The invention claimed is:

1. A substantially transparent electronic device comprising a first contact surface comprising:
   a first pattern of electrically conductive lines and
   a second contact surface provided with a second pattern of electrically conductive lines,
   the first contact surface extending parallel to the second contact surface, wherein
   the first pattern is rotationally displaced with respect to the second pattern by an angle between 15 and 165 degrees and wherein
   the electrically conductive lines of the first pattern and the second pattern are
      substantially non-transparent for visible light and
      are adapted to function as shunting lines, wherein the first pattern and the second pattern comprise respective curved mutually parallel lines.

2. An electronic device according to claim 1, wherein the first pattern and the second pattern are geometrically similar.

3. An electronic device according to claim 2, wherein the first pattern and the second pattern comprise a honeycomb structure.

4. A substantially transparent electronic device comprising a first contact surface comprising:
   a first pattern of electrically conductive lines and
   a second contact surface provided with a second pattern of electrically conductive lines,
   the first contact surface extending parallel to the second contact surface, wherein
   the electrically conductive lines of the first pattern and the second pattern are
      substantially non-transparent for visible light and
      are adapted to function as shunting lines.
   wherein the first pattern comprises a first square, the second pattern comprises a second square, the first square and the second square being rotationally displaced with respect to each other by a displacement angle between 15 and 75 degrees.

5. An electronic device according to any one of claim 1, 2, 3, or 4, wherein the electrically conductive lines of the said first pattern and the second pattern are arranged to function as shunting lines.

6. An organic light emitting diode (OLED) comprising a device according to any one of claim 1, 2, 3, or 4, wherein the first contact surface relates to the anode and the second contact surface relates to the cathode, the OLED further comprising a functional light emitting layer disposed between the first contact surface and the second contact surface.

7. An organic photovoltaic device (OPV) comprising an electronic device according to any one of claim 1, 2, 3, or 4, wherein the first contact surface relates to the anode and the second contact surface relates to the cathode, the OPV further comprising a functional organic change generation layer disposed between the first contact surface and the second contact surface.

8. An electrochromic device (EC) comprising an electronic device according to any one of claim 1, 2, 3, or 4, wherein the first contact surface relate to the anode and the second contact surface relate to the cathode, the EC further comprising a functional layer of material disposed between the first contact surface and the second contact surface, said functional layer being adapted to change its transmission to light in use.

9. A method of manufacturing a substantially transparent electronic device, comprising the steps of:
   providing a first contact surface with a first pattern of respective curved mutually parallel electrically conductive lines;
   providing a second contact surface extending substantially parallel to the first contact surface;
   providing a second pattern of respective curved mutually parallel electrically conductive lines on the second contact surface, wherein the second pattern is rotationally displaced with respect to the first pattern by an angle between 15 and 165 degrees;

selecting for the electrically conductive lines of the first pattern and the second pattern a material substantially not transparent for visible light.

10. A method according to claim 9, wherein the device comprises OLED, the method further comprising the steps of:
arranging an anode comprising on the first contact surface;
arranging a cathode on the second contact surface;
disposing a functional light emitting layer between the cathode and the anode.

11. A method of manufacturing a substantially transparent electronic device, comprising the steps of:
providing a first contact surface with a first pattern of electrically conductive lines, wherein the first pattern comprises a first square;
providing a second contact surface extending substantially parallel to the first contact surface;
providing a second pattern of electrically conductive lines on the second contact surface, wherein the second pattern comprises a second square, wherein the second square is rotationally displaced with respect to the first square by an angle between 15 and 75 degrees; and
selecting for the electrically conductive lines of the first pattern and the second pattern a material substantially not transparent for visible light.

* * * * *

UNITED STATES PATENT AND TRADEMARK OFFICE
CERTIFICATE OF CORRECTION

PATENT NO.        : 8,592,854 B2                                        Page 1 of 1
APPLICATION NO.   : 13/265452
DATED             : November 26, 2013
INVENTOR(S)       : Kruijt et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 67 days.

Signed and Sealed this
Twenty-second Day of September, 2015

Michelle K. Lee
*Director of the United States Patent and Trademark Office*